US008120132B2

(12) United States Patent
Guha et al.

(10) Patent No.: US 8,120,132 B2
(45) Date of Patent: Feb. 21, 2012

(54) HOLEY ELECTRODE GRIDS FOR PHOTOVOLTAIC CELLS WITH SUBWAVELENGTH AND SUPERWAVELENGTH FEATURE SIZES

(75) Inventors: Supratik Guha, Chappaqua, NY (US); Oki Gunawan, Fair Lawn, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/196,334

(22) Filed: Aug. 2, 2011

(65) Prior Publication Data

US 2011/0284073 A1    Nov. 24, 2011

Related U.S. Application Data

(62) Division of application No. 12/621,226, filed on Nov. 18, 2009, now Pat. No. 8,039,292.

(51) Int. Cl.
*H01L 31/0224* (2006.01)
(52) U.S. Cl. ............... 257/459; 257/457; 257/E27.124; 257/E25.009; 136/256
(58) Field of Classification Search .................. 257/431, 257/435, 436, 457, 459, E27.124, E27.125, 257/E25.007, E25.009; 136/256
See application file for complete search history.

(56) References Cited

U.S. PATENT DOCUMENTS

| 4,228,315 | A | 10/1980 | Napoli |
| 5,973,316 | A | 10/1999 | Ebbesen et al. |
| 6,052,238 | A | 4/2000 | Ebbesen et al. |
| 6,236,033 | B1 | 5/2001 | Ebbesen et al. |
| 6,285,020 | B1 | 9/2001 | Kim et al. |
| 6,441,298 | B1 | 8/2002 | Thio |
| 6,504,180 | B1 | 1/2003 | Heremans et al. |
| 6,521,541 | B2 | 2/2003 | Rossi |
| 6,579,463 | B1 | 6/2003 | Winningham et al. |
| 6,649,901 | B2 | 11/2003 | Thio et al. |
| 6,831,017 | B1 | 12/2004 | Li et al. |
| 7,033,936 | B1 | 4/2006 | Green |

(Continued)

FOREIGN PATENT DOCUMENTS

EP    0 969 517 A1    1/2000

(Continued)

OTHER PUBLICATIONS

Tan et al., "Fabrication of Size-Tunable Gold Nanoparticles Array with Nanosphere Lithography, Reactive Ion Etching, and Thermal Annealing" Journal of Physical Chemistry B (May 2005) pp. 11100-11109, vol. 109.

(Continued)

*Primary Examiner* — David Vu
*Assistant Examiner* — Earl Taylor
(74) *Attorney, Agent, or Firm* — Scully, Scott, Murphy & Presser, P.C.; Vazken Alexanian (57) ABSTRACT

A photovoltaic cell and a method of forming an electrode grid on a photovoltaic semiconductor substrate of a photovoltaic cell are disclosed. In one embodiment, the photovoltaic cell comprises a photovoltaic semiconductor substrate; a back electrode electrically connected to a back surface of the substrate; and a front electrode electrically connected to a front surface of the substrate. The substrate, back electrode, and front electrode form an electric circuit for generating an electric current when said substrate absorbs light. The front electrode is comprised of a metal grid defining a multitude of holes. These holes may be periodic, aperiodic, or partially periodic. The front electrode may be formed by depositing nanospheres on the substrate; forming a metallic layer on the substrate, around the nanospheres; and removing the nanospheres, leaving an electrode grid defining a multitude of holes on the substrate.

15 Claims, 7 Drawing Sheets

SCALING CONCEPT OF THE FINGER OF THE SOLAR CELL BY REPLACING FINGERS WITH GRID OF METAL ARRAY

U.S. PATENT DOCUMENTS

| | | |
|---|---|---|
| 7,087,833 B2 | 8/2006 | Scher et al. |
| 7,110,154 B2 | 9/2006 | Ballato et al. |
| 7,179,988 B2 | 2/2007 | Spivack et al. |
| 7,385,231 B2 | 6/2008 | Fujimoto et al. |
| 2002/0023894 A1 | 2/2002 | Rossi |
| 2003/0221718 A1 | 12/2003 | Kubo et al. |
| 2004/0105810 A1 | 6/2004 | Ren et al. |
| 2004/0180379 A1 | 9/2004 | Van Duyne et al. |
| 2005/0196596 A1 | 9/2005 | Salafsky |
| 2006/0131261 A1 | 6/2006 | Green |
| 2006/0228897 A1 | 10/2006 | Timans |
| 2007/0049047 A1 | 3/2007 | Fujimoto et al. |
| 2007/0128707 A1 | 6/2007 | Rorrer et al. |
| 2008/0023577 A1 | 1/2008 | Zhen et al. |
| 2008/0081016 A1 | 4/2008 | Peng et al. |
| 2009/0131274 A1 | 5/2009 | Pison et al. |
| 2009/0194160 A1 | 8/2009 | Chin et al. |
| 2009/0213367 A1 | 8/2009 | Green |
| 2009/0231714 A1 | 9/2009 | Zhao et al. |
| 2009/0269558 A1 | 10/2009 | Himmelhaus et al. |
| 2010/0080954 A1 | 4/2010 | Mohseni |
| 2010/0096004 A1 | 4/2010 | Hu et al. |
| 2010/0175749 A1 | 7/2010 | Tsutsumi et al. |
| 2010/0178417 A1 | 7/2010 | Connor et al. |

FOREIGN PATENT DOCUMENTS

| | | |
|---|---|---|
| EP | 1 180 802 A2 | 2/2002 |
| JP | 2010157681 A | 7/2010 |
| JP | 2010219407 A | 9/2010 |
| WO | WO 2009/119161 A2 | 10/2009 |

OTHER PUBLICATIONS

Zhang et al., "Advances in Contemporary Nanosphere Lithographic Techniques, Journal of Nanoscience and Nanotechnology" Journal of Nanoscience and Nanotechnology (2006) pp. 1-15, vol. 6.

Winzer et al., "Fabrication of nano-dot and nano-ring-arrays by Nanosphere Lithography" Applied Physics A (1996) pp. 617-619, vol. 63.

Stiles et al., "Surface-Enhanced Raman Spectroscopy" Annual Review Analytical Chemistry (Mar. 2008) pp. 601-626, vol. 1.

Musil et al., "Nanostructuring of Gold Electrodes for Immunosensing Applications" Journal of Vacuum Science and Technology (Nov./Dec. 1995) pp. 2781-2786, vol. 13, No. 6.

Dick et al., "Metal Film Over Nanosphere (MFON) Electrodes for Surface-Enhanced Raman Spectroscopy (SERS): Improvements in Surface Nanostructure Stability and Suppression of Irreversible Loss" Journal of Physical Chemistry B (Dec. 2001) pp. 853-860, vol. 106.

Cheung et al., "Fabrication of Nanopillars by Nanosphere Lithograph" Institute of Physics Publishing, Nanotechnology (20060 pp. 1339-1343, vol. 17.

Marks et al., "Progress in High Work Function TCO OLED Anode Alternatives and OLED Nanopixelation" Synthetic Metals (2002) pp. 29-35, vol. 127.

Hulteen et al., "Nanosphere Lithography: A Materials General Fabrication Process for Periodic Particle Array Surfaces" Journal of Vacuum Science and Technology A (May/Jun. 1995) pp. 1553-1558, vol. 13, No. 3.

Kandulski, "Shadow Nanosphere Lithography" Ph.D. Thesis, University of Bonn (Jun. 2007).

Chen et al., "Using Colloidal Lithography to Fabricate and Optimize Sub-Wavelength Pyramidal and Honeycomb Structures in Solar Cells" Optics Express (Oct. 2007) pp. 14793-14803, vol. 15, No. 22.

Inns et al., "Wafer Surface Charge Reversal as a Method of Simplifying Nanosphere Lithography for Reactive Ion Etch texturing of Solar Cells" Advances in OptoElectronics (2007) pp. 1-4, Article ID 32707.

Reilly III et al., "Surface-Plasmon Enhanced Transparent Electrodes in Organic Photovoltaics" Applied Physics Letters (Jun. 2008) pp. 1-3, vol. 92, No. 243304.

Bent et al., "Inorganic Nanocomposite Solar cells by Atomic Layer Deposition (ALD)" GCEP Technical Report (2006) pp. 1-10.

Ozturk et al., "Nanosphere Lithography of Nanostructured Silver Films on Thin-Film Solar Cells for Light Trapping" Materials Research Society Symposium Proceedings (Spring 2009) 8 pages, vol. 1153, A07-14.

International Search Report from International application No. PCT/EP2010/065240, dated Dec. 9, 2011.

FIG. 1

THE EFFECT OF SERIES RESISTANCE (FROM THE BUSBAR AND FINGER ELECTRODE) ON CELL EFFICIENCY

SCALING CONCEPT OF THE FINGER OF THE SOLAR CELL BY REPLACING FINGERS WITH GRID OF METAL ARRAY

ENHANCED TRANSMISSION EFFECT THROUGH AN
ARRAY OF HOLES OF SUBWAVELENGTH SIZE

FIG. 4(a)

EXPERIMENTAL DATA FOR VARIOUS HOLE SIZES

NOTE THAT THE TRANSMISSIVITY ONLY
ACCOUNTS FOR THE HOLE AREA

NANOSPHERE TRIMMING WITH $O_2$ PLASMA

FIG. 7(a)

THE RESULTING ELECTRODE STRUCTURE

HOLEY ELECTRODE GRIDS FOR PHOTOVOLTAIC CELLS WITH SUBWAVELENGTH AND SUPERWAVELENGTH FEATURE SIZES

CROSS REFERENCE TO RELATED APPLICATION

This application is a divisional of U.S. patent application Ser. No. 12/621,226, filed Nov. 18, 2009 the entire content and disclosure of which is incorporated herein by reference.

BACKGROUND OF THE INVENTION

1. Field of the Invention

This invention generally relates to solar or light energy, and more specifically, the invention relates to photovoltaic cells.

2. Background Art

Solar energy has long been looked to as a significant part of a solution to the ever increasing energy needs of the planet's population. Increasing costs of mining fossil fuels and increased concerns over "greenhouse" emissions have furthered interest in exploiting alternative energy strategies, including solar energy sources. To date, solar energy conversion has generally relied upon either the direct harvesting of solar thermal energy, e.g., in heating applications, or in thermoelectric conversion, or through the direct conversion of photonic energy to electrical energy through the use of photovoltaic cells.

Photovoltaic cells have developed according to two distinct methods. The initial operational cells employed a matrix of single crystal silicon appropriately doped to produce a planar p-n junction. An intrinsic electric field established at the p-n junction produces a voltage by directing solar photon produced holes and free electrons in opposite directions. Despite good conversion efficiencies and long-term reliability, widespread energy collection using single-crystal silicon cells is thwarted by the exceptionally high cost of single crystal silicon material and interconnection processing.

A second approach to produce photovoltaic cells is by depositing thin photovoltaic semiconductor films on a supporting substrate. Material requirements are minimized and technologies can be proposed for mass production. The thin film structures can be designed according to doped homojunction technology such as that involving silicon films, or can employ heterojunction approaches such as those using CdTe or chalcopyrite materials. Despite significant improvements in individual cell conversion efficiencies for both single crystal and thin film approaches, photovoltaic energy collection has been generally restricted to applications having low power requirements.

In all solar cells, especially the high performance ones, series resistance issue is a serious limiting factor for cell performance. This series resistance is associated with the contact electrode geometry, emitter (top) layer sheet resistance, and metal-semiconductor contact resistance. The design of the electrode structure must consider the trade off between area coverage and the shadowing loss. A standard approach is to use comb-like metal grids or to use transparent conducting oxide (TCO) film that combines transparency and good conductivity of the film. However such TCO film still has a limited conductivity and still contributes to considerable amount of series resistance.

BRIEF SUMMARY

Embodiments of the invention provide a photovoltaic cell and a method of forming an electrode grid on a photovoltaic semiconductor substrate of a photovoltaic cell. In one embodiment, the photovoltaic cell comprises a photovoltaic semiconductor substrate having a front, light receiving surface, and a back surface; a back electrode electrically connected to said back surface; and a front electrode electrically connected to the front surface. The substrate, back electrode, and front electrode form an electric circuit for generating an electric current when said substrate absorbs light. The front electrode is comprised of a metal grid defining a multitude of holes having widths less than 1000 nms.

In one embodiment, the holes of the front electrode form a periodic pattern in the front electrode, and for example, this pattern may repeat with a period between 200 nms and 50 ums. In another embodiment, the holes of the front electrode form an aperiodic pattern in said front electrode. In another embodiment, the holes in the front electrode form a partially periodic pattern in said front electrode.

In one embodiment, the holes in the front electrode have circular shapes with diameters between 100 and 1000 nms. In one embodiment, the photovoltaic cell is for use with light at a wavelength $\lambda$, and said multitude of holes in the front electrode have widths greater than $\lambda$. In another embodiment, the photovoltaic cell is for use with light at a wavelength $\lambda$, and the multitude of holes in the front electrode have widths less than $\lambda$. In another embodiment, the photovoltaic cell is for use with light at a wavelength $\lambda$, and some of the holes in the front electrode have widths greater than $\lambda$, while others of these holes have widths less than $\lambda$. In one embodiment, the front electrode extends over a defined area of the front surface of said substrate, and the holes of the front electrode cover more than 80% of said defined area.

In one embodiment of the invention, a method is provided for forming an electrode grid on a photovoltaic semiconductor substrate. In one embodiment, the method comprises depositing a quantity of nanoshperes on said substrate; forming a metallic layer on the substrate, around said nanospheres; and removing said nanoshperes, whereby an electrode grid defining a multitude of holes is left on the substrate, electrically connected thereto.

In one embodiment, the depositing includes forming a monolayer of the nanospheres on said substrate. In an embodiment, the depositing includes trimming said nanospheres to a desired size; and, for example, this trimming may be done using $O_2$. In one embodiment, said forming includes depositing a layer of a metal on the substrate and the nanospheres. In an embodiment, said removing includes lifting the nanospheres off said substrate; and, for example, this may be done by peeling the nanoshperes off said substrate using a tape and cleaning the substrate in a hot solvent such as acetone or NMP (N-Methyl-2-pyrrolidone)

Embodiments of the invention use metal electrode to retain its very high conductivity (~100× larger than best TCO), patterned into holey structures with subwavelength or superwavelength feature size while maintaining the same level of shadowing loss. Depending on the size of the holes and their periodicity, the invention can achieve significant benefits such as: reduced cell series resistance, as the metal grid has larger area coverage so the current transport are not limited by the (high) emitter sheet resistance anymore, and enhanced light transmission due to subwavelength electrode linewidth (that is invisible to light) or due to plasmonics effect.

DETAILED DESCRIPTION

Figure 1:
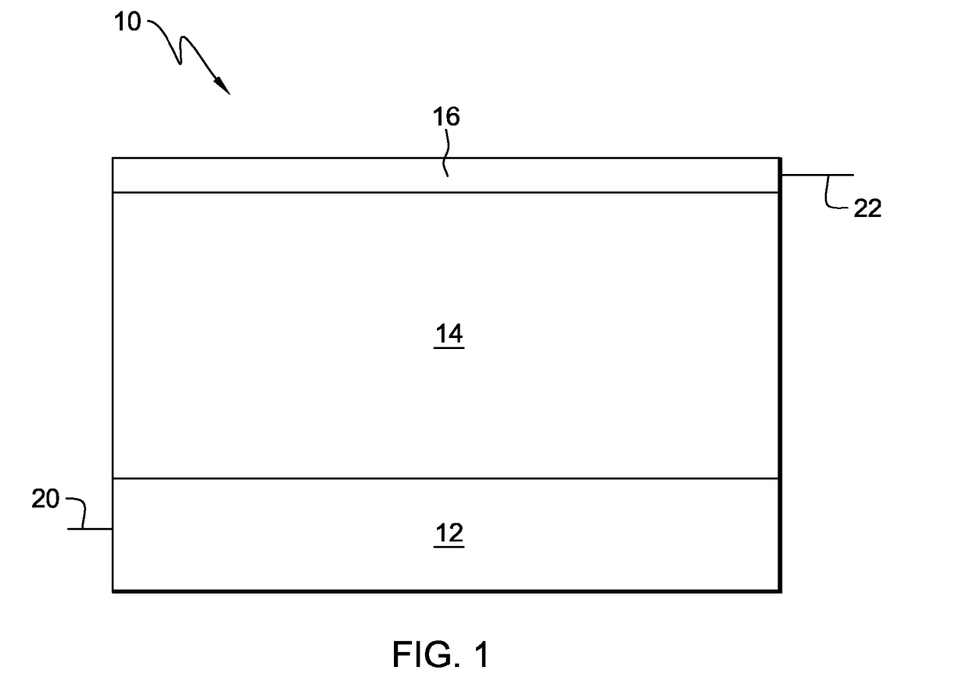
FIG. 1 is a diagram of a photovoltaic device.

FIG. 1 is a diagram of a photovoltaic (PV) device, or solar cell, 10. The PV device 10 includes a back electrode layer 12, a PV material 14 and a front electrode 16. Light energy is transmitted to the PV layer 14, where it is absorbed and transformed into electric energy. The electricity generated within the PV device 10 migrates to either the front electrode 16 or the back electrode 12, from where it is directed out of the cell through an electrical contact 20 or 22. The PV layer 14 may be constructed of any among many different types of materials, including, but not limited to, semiconductor junctions, organic-dye based materials, photoelectrochemical cells, polymer solar cells, nanocrystal solar cells or dye sensitized solar cells, as well as other PV cell technologies.

More specifically, in the device of FIG. 1, the PV material 14 may be a semiconductor substrate comprised of a polycrystalline silicon but can also be a single-crystalline silicon, and it is of a p-type with, for example, an impurity concentration of $5 \times 10^{16}$ cm$^{-3}$ with boron as the impurity, for example. The thickness of this semiconductor substrate 14 may be from 1 μm to 150 μm. An aluminum oxide ($Al_2O_3$) diffuse-reflection substrate (not shown) that is 800 μm thick, for example, may be adhered to the back surface of the semiconductor substrate 14.

Figure 2A:
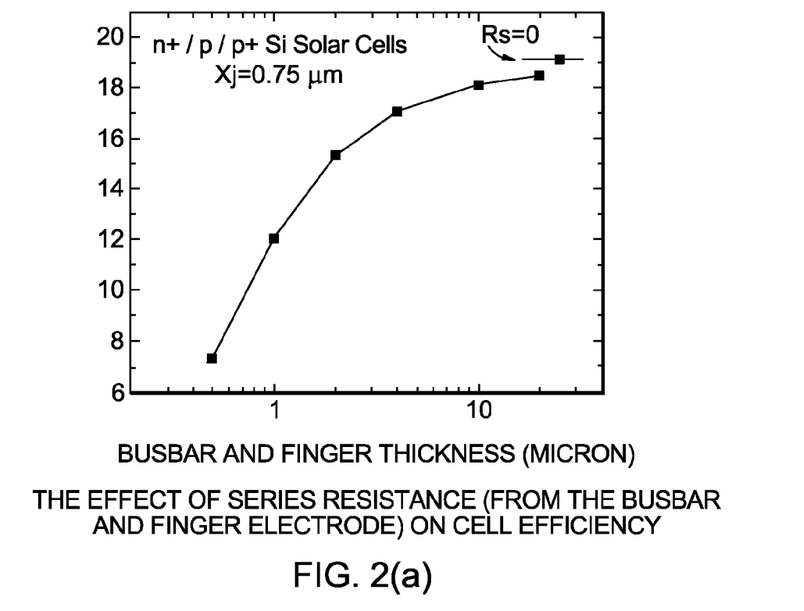
FIG. 2(a) illustrates the impact of varying electrode thickness to the efficiency of a photovoltaic cell.

As mentioned above, series resistance associated with the contact electrode is a serious limiting factor for high performance solar cells. FIG. 2(a) illustrates the impact of the varying electrode thickness (or the electrode series resistance) to the cell efficiency. Thus engineering an optimum contact electrode is critical in achieving peak performance for all type solar cells.

Figure 2B:
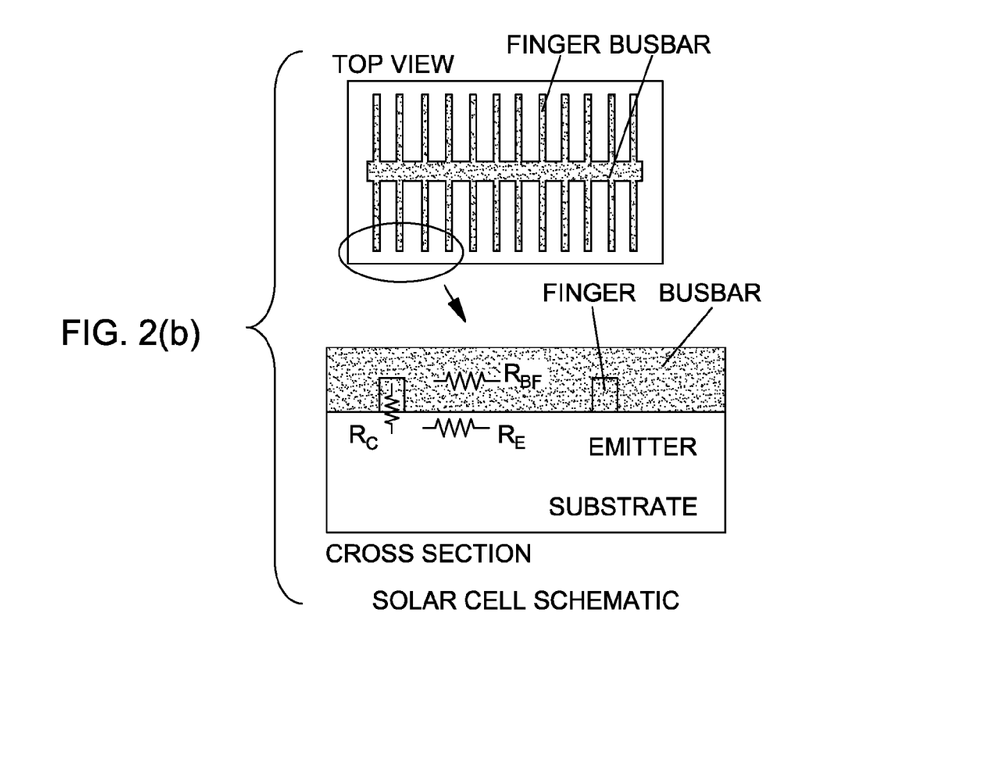
FIG. 2(b) illustrates the components of the overall series resistance of a photovoltaic cell.

The overall cell series resistance originates mainly from three components as shown in FIG. 2(b): emitter layer resistance ($R_E$), electrode (busbar and finger) resistance $R_{BF}$ and the electrode-semiconductor contact resistance ($R_C$). Other than these factors, the shadowing loss due to the electrode coverage (typically ~10%) also accounts for the loss of the cell performance. These series resistances could be reduced by increasing the area coverage but this will increase the shadowing loss. One could also make the electrode thicker, but this is often limited by the deposition technique.

Ideally a solar cell needs a contact electrode that is transparent but highly conductive to minimize the shadowing loss and series resistance losses. One attempt is to use transparent conducting oxide film such as indium tin oxide (typical transmission ~80% and sheet resistance ~20/sq). The present invention provides an alternative technique, utilizing an electrode grid that reduces both series resistance and effectively reduces the shadowing loss of the electrode.

Figure 3:
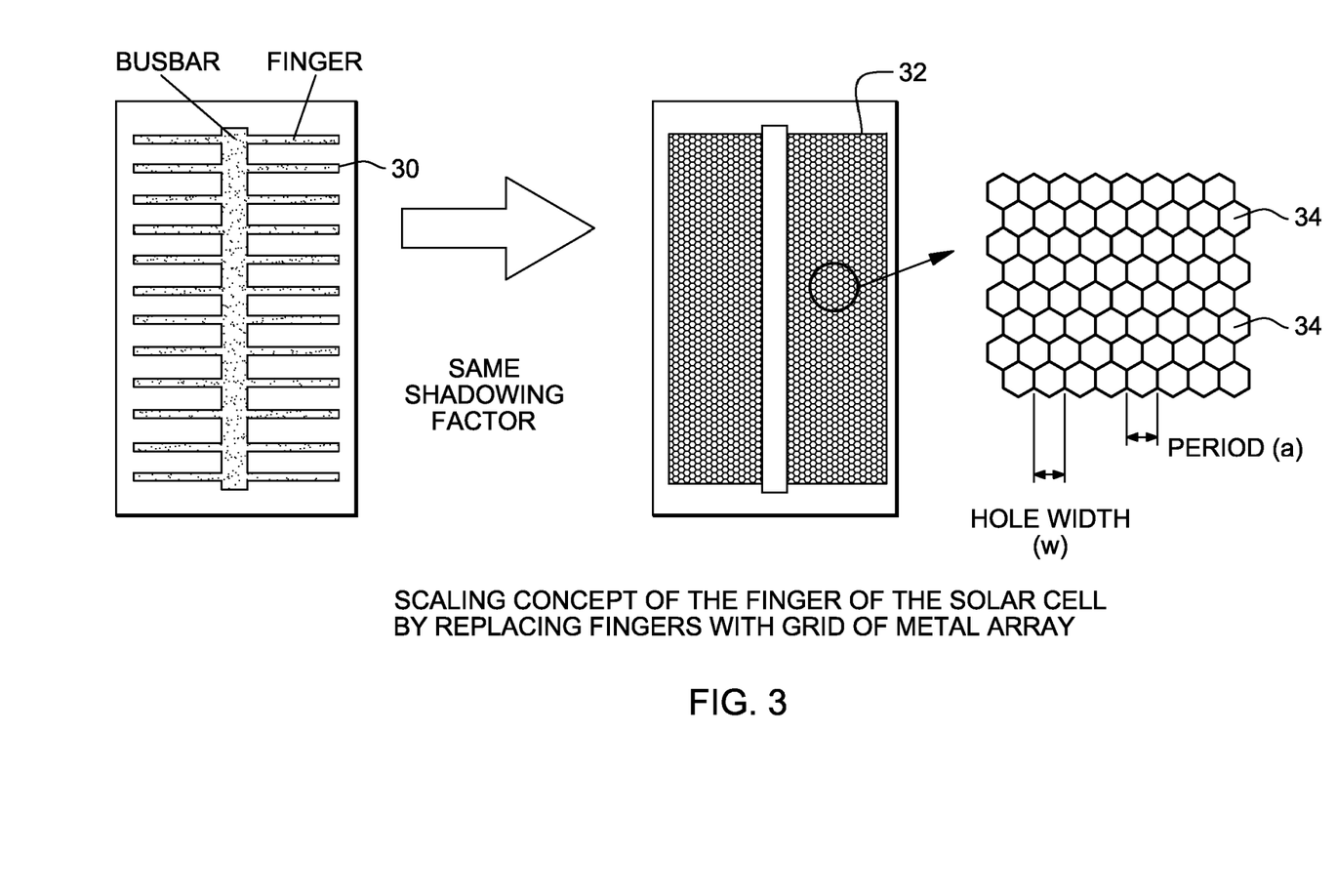
FIG. 3 illustrated the principle of replacing the fingers of a photovoltaic cell with a holey electrode grid.

With reference to FIG. 3, in accordance with an embodiment of this invention, the finger electrode 30 is replaced with a "holey" metal grid 32 with small feature size while keeping the same shadowing factor. The grid 32 can have holes 34 with both subwavelength dimensions (w<), as well as superwavelength dimensions (w>). The hole pattern may be periodic, may be aperiodic, or may be partially periodic. In the case of periodicity, the lattice period a may be, for example, ~200 nm to ~50 μm.

Such an electrode structure 32 provides important advantages. One significant advantage is reduced emitter series resistance ($R_E$), since the current path from the junction to the electrode are reduced. E.g. typical finger spacing of solar cell is 500 μm and the emitter series resistance scales with this value. By having a metal grid 32 with very small lattice spacing (e.g. in order of μm) the series resistance can be reduced significantly. Another important advantage is that, in the case where the hole dimensions are larger than the wavelength of light (w>), the metal will cover <20% of the area, resulting in >80% transmission. At the same time, the conductivity of the film will be high. As a result, these conducting holey films can be used both for thin film PV (as a replacement for ITO or doped ZnO) and for crystalline silicon. In the case of crystalline Si, since the lateral path for the minority carrier in the silicon is shorter, it is possible to dope the emitter to lower values, thereby improving minority carrier lifetimes in the emitter.

Figure 4A:
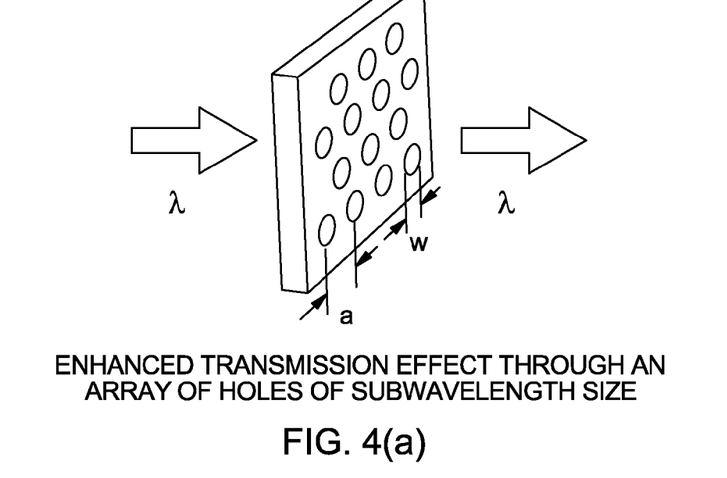
FIG. 4(a) shows the enhanced transmission effect through an array of holes of subwavelength size.
Figure 4B:
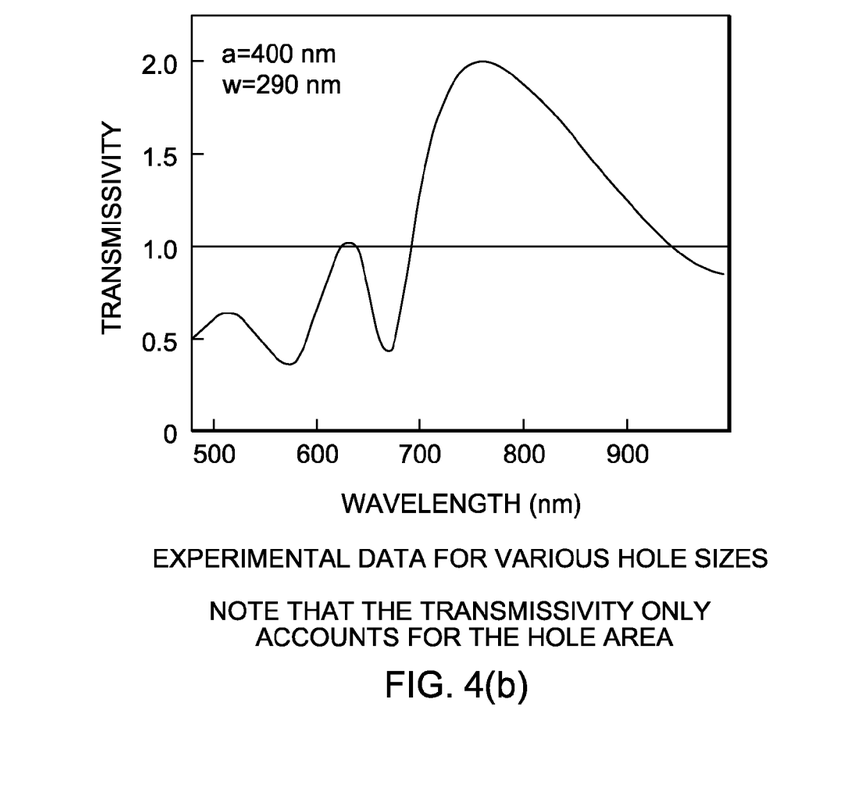
FIG. 4(b) shows experimental data for various hole sizes.

In the case where the hole dimension is smaller than the light wavelength (w<), since the grid has linewidth smaller than the wavelength of light, the grid lines will be less visible to the incoming light or the reflection will be reduced. This effectively reduces the shadowing loss due to the reflection of the electrode. Further, when the grid lattice period is smaller than the light's wavelength (a<), embodiments of the invention can exploit a plasmonics effect of enhanced transmission phenomena through an array of subwavelength holes. This effect occurs because the periodicity of the metal structure helps to couple the light and the surface plasmons more effectively and reradiate the light energy as transmitted light. This feature is illustrated in FIGS. 4(a) and 4(b). This effect could also potentially reduce the shadowing loss due to the electrode.

Fabrication of a structure with submicron structures over a large area is prohibitively expensive using standard lithography technique (deep UV or electron beam lithography). Thus a nanosphere lithography technique may be used to realize large scale but low cost patterning of a subwavelength metal grid for solar cell application.

Figure 5:
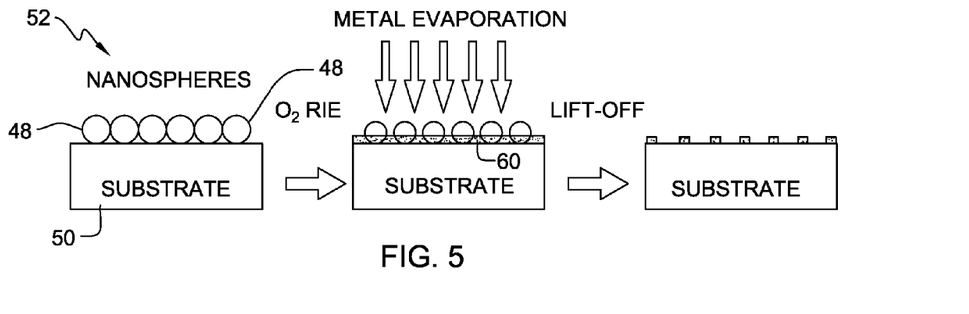
FIG. 5 illustrates a fabrication process of a holey electrode grid.
Figure 6:
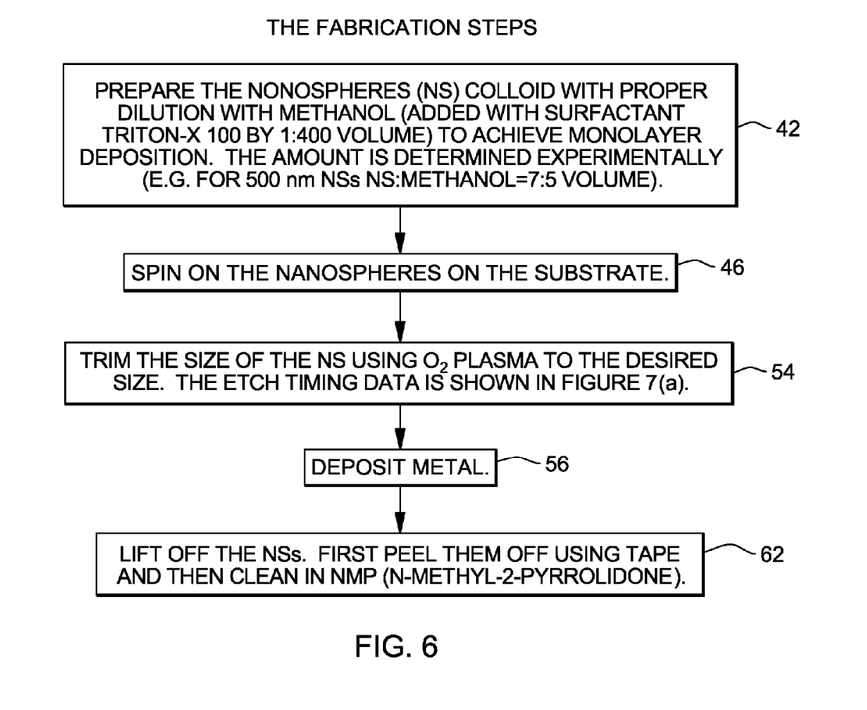
FIG. 6 shows fabrication steps that may be used in the fabrication process.
Figure 7A:
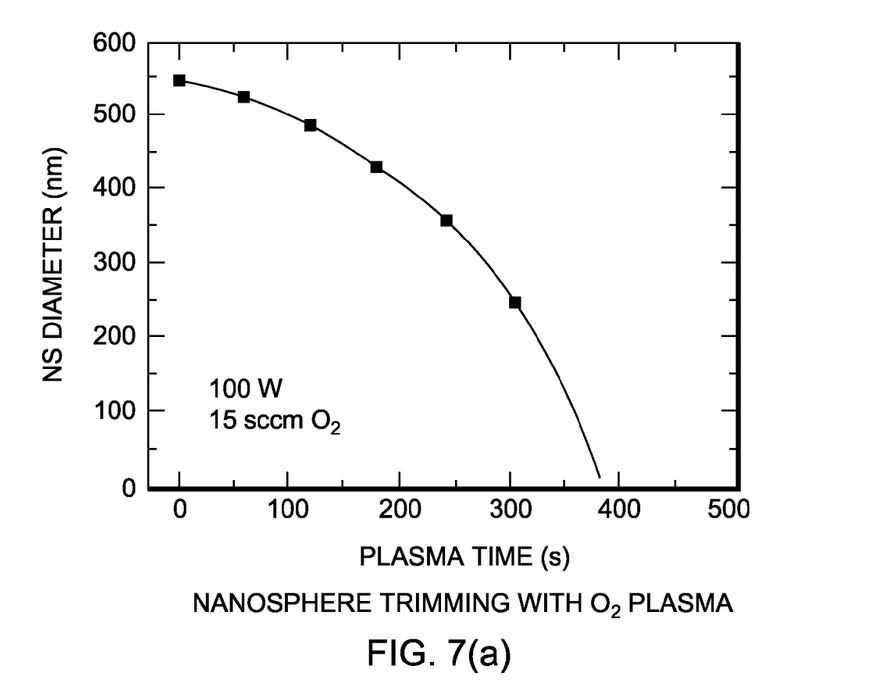
FIG. 7(a) shows an etch timing diagram for trimming the sizes of nanospheres in the fabrication process.

FIGS. 5 and 6 illustrate, as an example, a fabrication process that may be used to form the holey electrode grid. In this process, at step 42, the nanospheres (NS) colloid is prepared with proper dilution with methanol (added with surfactant Triton-X 100 by 1:400 volume) to achieve monolayer deposition. The amount is, in one embodiment, determined experimentally (e.g. for 500 nm NSs NS:methanol=7:5 volume). At step 46, the nanospheres 48 are spun on the substrate 50, as shown at 52. The size of the NS are trimmed at step 54 to the desired size using $O_2$ plasma. The etch timing data is shown in FIG. 7(a). At step 56, metal 60 is deposited onto the substrate.

At step 62, the NSs are lifted off the substrate. This may be done by first peeling the NSs off using tape and then cleaning using NMP (N-Methyl-2-pyrrolidone).

Figure 7B:
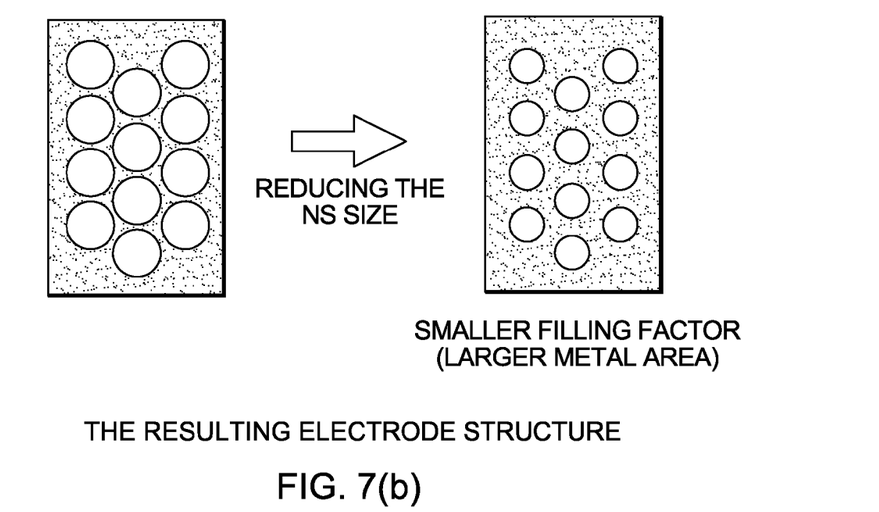
FIG. 7(b) illustrates two electrode grids that may be formed using the process of FIGS. 5 and 6.
Figure 8:
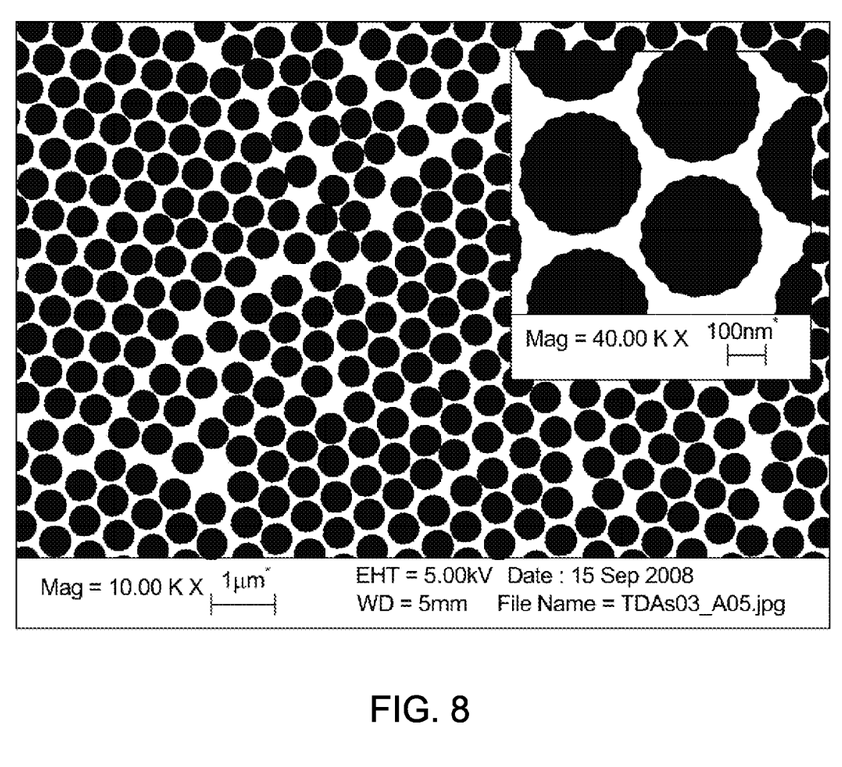
FIG. 8 shows a metal grid on Silicon substrate fabricated using nanosphere lithography.

A result of a metal grid 64 made by nanosphere lithography is shown in FIG. 8. Note that the holes filling factor can be controlled by controlling the size of the NSs with $O_2$ plasma trimming process as shown at 66 in FIG. 7(*b*). A larger filling factor means smaller shadowing loss. For a closely packed NS lattice as shown in FIG. 7(*b*), the minimum shadowing factor (area covered by metal) is $1-\sqrt{3}\pi/2$ or 9.3%. However since the feature size of the metal lines are smaller than the wavelength of light, the effective shadowing loss will be smaller.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope.

The invention claimed is:

1. A photovoltaic cell comprising:
   a photovoltaic semiconductor substrate having a front, light receiving surface, and a back surface;
   a back electrode electrically connected to said back surface; and
   a front electrode electrically connected to the front surface;
   wherein the substrate, back electrode, and front electrode form an electric circuit for generating an electric current when said substrate absorbs light; and
   wherein said front electrode is comprised of a metal grid defining a multitude of holes having widths less than 1000 nms, and the holes have a shape, size and pattern that provide the metal grid with greater than 80% transmission of light through the metal grid.

2. The photovoltaic cell according to claim 1, wherein said holes form a periodic pattern in said front electrode.

3. The photovoltaic cell according to claim 2, wherein said pattern repeats with a period between 200 nms and 50 ums.

4. The photovoltaic cell according to claim 1, wherein said holes form an aperiodic pattern in said front electrode.

5. The photovoltaic cell according to claim 1, wherein said holes form a partially periodic pattern in said front electrode.

6. The photovoltaic cell according to claim 1, wherein said holes have circular shapes with diameters between 100 and 1000 nms.

7. The photovoltaic cell according to claim 1, for use with light at a wavelength $\lambda$, and wherein said multitude of holes have widths greater than $\lambda$.

8. The photovoltaic cell according to claim 1, for use with light at a wavelength $\lambda$, and wherein said multitude of holes have widths less than $\lambda$.

9. The photovoltaic cell according to claim 1, for use with light at a wavelength $\lambda$, and wherein some of said multitude of holes have widths greater than $\lambda$, and others of said multitude of holes have widths less than $\lambda$.

10. The photovoltaic cell according to claim 1, wherein the electrode grid has a minimum shadowing factor of 9.3%.

11. A photovoltaic cell comprising:
    a photovoltaic semiconductor substrate having a front, light receiving surface, and a back surface;
    a back electrode electrically connected to said back surface; and
    a front electrode electrically connected to the front surface;
    wherein the substrate, back electrode, and front electrode form an electric circuit for generating an electric current when said substrate absorbs light; and
    wherein said front electrode is comprised of a metal grid attached to said front surface and defining a multitude of circular openings having diameters less than 1000 nms and forming a periodic pattern in said grid having a period of between 200 nms and 50 μms, and the shape, size and pattern of the openings of the metal grid provide the metal grid with greater than 80% transmission of light through the metal grid.

12. The photovoltaic cell according to claim 11 for converting photonic energy to said electrical current, said photonic energy having a defined average operating wavelength, and wherein said period is less than the average operating wavelength to enable a plasmonics effect of enhanced transmission phenomena of light through said openings.

13. The photovoltaic cell according to claim 11, wherein the diameters of said openings are less than 700 nm to reduce shadowing loss due to reflection of the front electrode.

14. The photovoltaic cell according to claim 11, wherein the openings have diameters between 100 and 1000 nms.

15. The photovoltaic cell according to claim 11, wherein the electrode grid, due to the shape, size and pattern of the openings of the electrode grid, couples light, using a surface plasmon effect, to reduce light energy as transmitted light.

\* \* \* \* \*